(12) United States Patent
Toyao

(10) Patent No.: US 9,634,370 B2
(45) Date of Patent: Apr. 25, 2017

(54) WAVEGUIDE STRUCTURE AND PRINTED-CIRCUIT BOARD

(71) Applicant: Hiroshi Toyao, Tokyo (JP)

(72) Inventor: Hiroshi Toyao, Tokyo (JP)

(73) Assignee: NEC CORPORATION, Tokyo (JP)

( * ) Notice: Subject to any disclaimer, the term of this patent is extended or adjusted under 35 U.S.C. 154(b) by 15 days.

(21) Appl. No.: 14/312,971

(22) Filed: Jun. 24, 2014

(65) Prior Publication Data

US 2014/0300429 A1    Oct. 9, 2014

Related U.S. Application Data

(63) Continuation of application No. 12/457,801, filed on Jun. 22, 2009, now Pat. No. 8,779,874.

(30) Foreign Application Priority Data

Jun. 24, 2008  (JP) ................. 2008-164338

(51) Int. Cl.
  *H01P 5/12* (2006.01)
  *H01P 3/02* (2006.01)
  (Continued)

(52) U.S. Cl.
  CPC ............ *H01P 3/026* (2013.01); *H01P 1/2005* (2013.01); *H01P 1/2013* (2013.01); *H01P 3/006* (2013.01);
  (Continued)

(58) Field of Classification Search
  CPC ...... H01P 1/2005; H01P 1/20363; H01P 1/20; H01P 1/20354; H01P 7/08; H01P 7/082
  (Continued)

(56) References Cited

U.S. PATENT DOCUMENTS

| 4,835,540 A | 5/1989 | Haruyama et al. |
| 5,598,168 A | 1/1997 | Evans et al. |

(Continued)

FOREIGN PATENT DOCUMENTS

| CN | 1914766 A | 2/2007 |
| CN | 101438555 A | 5/2009 |

(Continued)

OTHER PUBLICATIONS

Chinese Office Action dated Oct. 12, 2015 with a partial English translation.

(Continued)

*Primary Examiner* — Robert Pascal
*Assistant Examiner* — Kimberly Glenn
(74) *Attorney, Agent, or Firm* — McGinn IP Law Group, PLLC

(57) ABSTRACT

A waveguide structure or a printed-circuit board is formed using a plurality of unit structures which are repetitively aligned in a one-dimensional manner or in a two-dimensional manner. The unit structure includes first and second conductive planes which are disposed in parallel with each other, a transmission line having an open end which is formed in a layer different from the first and second conductive planes and positioned to face the second conductive plane, and a conductive via electrically connecting the transmission line to the first conductive plane.

17 Claims, 14 Drawing Sheets

(51) Int. Cl.

| | | |
|---|---|---|
| *H01P 1/20* | (2006.01) | |
| *H01P 3/08* | (2006.01) | |
| *H01P 5/02* | (2006.01) | |
| *H01P 7/08* | (2006.01) | |
| *H01Q 9/04* | (2006.01) | |
| *H05K 1/02* | (2006.01) | |
| *H01P 1/201* | (2006.01) | |
| *H01P 3/00* | (2006.01) | |
| *H05K 1/16* | (2006.01) | |
| *H05K 3/46* | (2006.01) | |

(52) U.S. Cl.
CPC .............. *H01P 3/081* (2013.01); *H01P 5/028* (2013.01); *H01P 7/082* (2013.01); *H01Q 9/04* (2013.01); *H05K 1/0236* (2013.01); *H05K 1/165* (2013.01); *H05K 3/4602* (2013.01); *H05K 2201/09236* (2013.01); *H05K 2201/09263* (2013.01); *H05K 2201/09309* (2013.01)

(58) Field of Classification Search
USPC .................. 333/204, 205, 219, 235; 343/909, 343/700 MS
See application file for complete search history.

(56) References Cited

U.S. PATENT DOCUMENTS

| | | | |
|---|---|---|---|
| 5,886,597 | A | 3/1999 | Riad |
| 7,136,029 | B2 * | 11/2006 | Ramprasad .............. H01Q 1/22 343/700 MS |
| 7,215,007 | B2 | 5/2007 | McKinzie, III et al. |
| 7,760,140 | B2 | 7/2010 | Kamgaing |
| 7,903,040 | B2 | 3/2011 | Gevorgian et al. |
| 8,153,907 | B2 | 4/2012 | Park et al. |
| 8,816,936 | B2 | 8/2014 | Toyao |
| 9,269,999 | B2 | 2/2016 | Toyao |
| 9,282,631 | B2 | 3/2016 | Chiu |
| 2003/0052757 | A1 | 3/2003 | McKinzie, III et al. |
| 2004/0001028 | A1 | 1/2004 | Killen et al. |
| 2004/0160367 | A1 | 8/2004 | Mendolia et al. |
| 2005/0029632 | A1 | 2/2005 | McKinzie, III et al. |
| 2005/0134522 | A1 | 6/2005 | Waltho |
| 2005/0195051 | A1 | 9/2005 | McKinzie, III |
| 2005/0205292 | A1 | 9/2005 | Rogers et al. |
| 2006/0038639 | A1 | 2/2006 | McKinzie, III |
| 2006/0044210 | A1 | 3/2006 | Ramprasad et al. |
| 2006/0044211 | A1 | 3/2006 | Ramprasad et al. |
| 2006/0186970 | A1 | 8/2006 | Shi et al. |
| 2007/0090398 | A1 | 4/2007 | McKinzie, III |
| 2007/0090901 | A1 | 4/2007 | Kanno et al. |
| 2007/0176827 | A1 | 8/2007 | Itoh et al. |
| 2007/0285188 | A1 | 12/2007 | Song et al. |
| 2007/0285336 | A1 | 12/2007 | Kamgaing |
| 2008/0001843 | A1 | 1/2008 | Wu et al. |
| 2008/0048917 | A1 | 2/2008 | Achour et al. |
| 2008/0143607 | A1 | 6/2008 | Jung et al. |
| 2008/0264685 | A1 * | 10/2008 | Park ..................... H05K 1/0236 174/262 |
| 2008/0266018 | A1 | 10/2008 | Han et al. |
| 2008/0272977 | A1 | 11/2008 | Gaucher et al. |
| 2008/0314635 | A1 | 12/2008 | Kim |
| 2009/0272206 | A1 | 11/2009 | Stumpf |
| 2011/0316651 | A1 | 12/2011 | Jung et al. |
| 2012/0194291 | A1 | 8/2012 | Pajovic |
| 2014/0091879 | A1 * | 4/2014 | Toyao ................... H01P 1/2005 333/135 |
| 2014/0152520 | A1 * | 6/2014 | Toyao ................... H01P 1/2005 343/776 |
| 2014/0300429 | A1 | 10/2014 | Toyao |
| 2016/0014887 | A1 * | 1/2016 | Kasahara ............. H05K 1/0236 174/262 |

FOREIGN PATENT DOCUMENTS

| | | |
|---|---|---|
| EP | 1 860 724 A1 | 11/2007 |
| JP | S62-147903 U | 9/1987 |
| JP | 3-198402 | 8/1991 |
| JP | H07-249902 A | 9/1995 |
| JP | H08-139504 A | 5/1996 |
| JP | 2002-204123 A | 7/2002 |
| JP | 2003-529261 A | 9/2003 |
| JP | 2003-304113 A | 10/2003 |
| JP | 2004-140210 A | 5/2004 |
| JP | 2006-245984 A | 9/2006 |
| JP | 2006-253929 A | 9/2006 |
| JP | 2007-522735 A | 8/2007 |
| JP | 2008-236027 A | 10/2008 |
| JP | 2009-021594 A | 1/2009 |
| JP | 2010-010183 A | 1/2010 |
| JP | 2010-199881 A | 9/2010 |
| JP | 2011-165824 A | 8/2011 |
| WO | WO 02/103846 A1 | 12/2002 |
| WO | WO 2005/002295 A2 | 1/2005 |
| WO | WO 2005/076408 A1 | 8/2005 |
| WO | WO 2007/146711 A1 | 12/2007 |
| WO | WO 2008/054324 A1 | 5/2008 |
| WO | WO 2008/062562 A | 5/2008 |
| WO | WO 2012/042740 A1 | 4/2012 |

OTHER PUBLICATIONS

Japanese Notice of Allowance dated Feb. 17, 2015 with a partial English translation.
Samil, et al., "Electromagnetic Band-Gap Structures: Classification, Characterization, and Applications", Apr. 17-20, 2001, IEEE, p. 560-564.
Japanese Office Action dated Oct. 2, 2012 with a partial English translation.
Extended European Search Resort dated Nov. 30, 2009.
Li Yang, et al., "A Spiral Electromagnetic Bandgap (EBG) Structure and its Application in Microstrip Antenna Arrays", Microwave Conference Proceedings, 2005; APMC 2005, Asia-Pacific Conference Proceedings Suzhou, China Dec. 4-7, 2005, Piscataway, NJ, USA IEEE, vol. 3, Dec. 4, 2005, pp. 1-4.
Chinese Office Action dated May 16, 2012 with an English Translation.
Chinese Office Action dated Feb. 4, 2013 with an English Translation.
United States Notice of Allowance dated Mar. 6, 2014 in U.S. Appl. No. 12/457,801.
United States Office Action dated Nov. 27, 2013 in U.S. Appl. No. 12/457,801.
United States Office Action dated Jun. 6, 2013 in U.S. Appl. No. 12/457,801.
United States Office Action dated Dec. 19, 2012 in U.S. Appl. No. 12/457,801.
United States Office Action dated Jun. 19, 2012 in U.S. Appl. No. 12/457,801.
Liang, Jing, et al. "Radiation Characteristics of Microstrip Patch Over an Electromagnetic Bandgap Surface". IEEE Transactions on Antennas and Propagation, vol. 55, No. 6, Jun. 2007.
Liu, et al., Enhanced Bandwidth Uniplanar Compact Electromagnetic Bandgap Structure with Coplanar Meander Line Inductance, Electronics Letters, Feb. 14, 2008, vol. 44, No. 4, pp. 260-261.
United States Office Action dated Apr. 24, 2014 in U.S. Appl. No. 13/254,326.
United States Office Action dated May 11, 2015 in U.S. Appl. No. 13/254,326.
International Search Report (ISR) (PCT Form PCT/ISA/210), in PCT/JP2010/002953, dated Aug. 3, 2010.
International Search Report (ISR) (PCT Form PCT/ISA/210), in PCT/JP2014/054279, dated May 13, 2014.
United States Office Action dated Feb. 9, 2016 in U.S. Appl. No. 14/096,755.
United States Office Action dated Aug. 4, 2016 in U.S. Appl. No. 14/096,755.

(56) References Cited

OTHER PUBLICATIONS

United States Office Action dated Jul. 28, 2016 in U.S. Appl. No. 14/096,771.
European Search Report dated Jul. 23, 2010.
United States Office Action dated Mar. 13, 2012 in U.S. Appl. No. 12/457,802.
United States Office Action dated Sep. 19, 2012, in U.S. Appl. No. 12/457,802.
Japanese Office Action dated Mar. 12, 2013, with partial English translation.
United States Office Action dated Jun. 4, 2013, in U.S. Appl. No. 12/457,802.
Japanese Notice of Allowance dated Jun. 25, 2013, with partial English translation.
United States Office Action dated Jan. 13, 2014, in U.S. Appl. No. 12/457,802.
European Search Report dated Jul. 23, 2010. In European Application No. 09163463.4.
Japanese Office Action dated Mar. 12, 2013, with partial English translation. In JP 2009-041356.
Japanese Notice of Allowance dated Jun. 25, 2013, with partial English translation. In JP 2009-041356.
United States Office Action dated May 27, 2016, in U.S. Appl. No. 14/312,931.
United States Notice of Allowance dated Jan. 13, 2017, in U.S. Appl. No. 14/096,755.

\* cited by examiner

WAVEGUIDE STRUCTURE AND PRINTED-CIRCUIT BOARD

The present application is a Continuation Application of U.S. patent application Ser. No. 12/457,801, filed on Jun. 22, 2009.

BACKGROUND OF THE INVENTION

1. Field of the Invention

The present invention relates to waveguide structures for use in propagation of electromagnetic waves such as microwaves and millimeter waves, and in particular to electromagnetic-band-gap (EBG) structures for suppressing propagation of electromagnetic waves in specific frequency bands. The present invention also relates to printed-circuit boards including waveguide structures.

The present application claims priority on Japanese Patent Application No. 2008-164338, the content of which is incorporated herein by reference.

2. Description of Related Art

Various technologies regarding waveguide structures and printed-circuit boards for suppressing propagation of electromagnetic waves in specific frequency bands have been developed and disclosed in various documents.

Patent Document 1: U.S. Patent Application Publication, US 2005/019051 A1

Patent Document 2: U.S. Patent Application Publication, US 2005/0205292 A1

Recently, methods for artificially controlling frequency dispersions of electromagnetic waves by use of repetitively aligned conductive patches have been provided. Among those structures, structures having band gaps in frequency dispersions are referred to as EBG structures, which are expectedly applied to filters for suppressing propagation of unwanted noise in printed-circuit boards or substrates of device packages.

Patent Document 1 teaches an EBG structure for reducing noise propagation between parallel plates. The EBG structure includes conductive patches, which are aligned in a third layer between parallel plates and which serve as capacitances for one conductive plane of the parallel plates, and admittances (or shunts) for connecting the conductive patches to another conductive plane of the parallel plates, wherein the admittances are repetitively aligned in a one-dimensional manner or a two-dimensional manner along the parallel plates. Due to band gaps occurring in frequency bands in which the admittances serve as inductances in the EBG structure, it is possible to set band gaps by controlling serial-LC resonance frequencies of admittances.

Securing adequate capacitances and inductances in the above EBG structure leads to increasing the areas of conductive patches or increasing the lengths of conductive vias, which in turn makes it difficult to reduce the sizes of structures.

Patent Document 2 teaches a structure in which chip capacitors are mounted on the surface and are connected in parallel between conductive planes and conductive patches. This structure increases capacitances without increasing the areas of conductive patches.

However, Patent Document 2 discloses that using chip capacitors increases the number of parts so as to increase the manufacturing cost.

In the above circumstances, the inventor has recognized that it is necessary to fabricate an EBG structure (or a waveguide structure) and a printed-circuit board with a reduced size, without using chip components, and with low manufacturing cost.

SUMMARY

The present invention seeks to solve the above problem, or to improve upon the problem at least in part.

The present invention is directed to a structure or a printed-circuit board, which includes a plurality of unit structures repetitively aligned in a one-dimensional manner or a two-dimensional manner.

In a first embodiment, the unit structure includes first and second conductive planes which are disposed in parallel with each other, a transmission line having an open end which is formed in a layer different from the first and second conductive planes and positioned to face the second conductive plane, and a conductive via electrically connecting the transmission line to the first conductive plane.

In a second embodiment, the unit structure includes first and second conductive planes which are disposed in parallel with each other, a first transmission line laid on a first plane which is positioned between the first and second conductive planes so as to face the second conductive plane, a second transmission line having an open end laid on a second plane which is positioned to face the second conductive plane outside a region circumscribed between the first and second conductive planes, a first conductive via electrically connecting the first transmission line to the first conductive plane, and a second conductive via electrically connecting the first transmission line to the second transmission line. In addition, a clearance is formed at a prescribed position corresponding to the second conductive in the second conductive plane, thus electrically isolating the second conductive plane from the second conductive via.

In a third embodiment, the unit structure includes first and second conductive planes which are disposed in parallel with each other, a first transmission line having an open end which is formed in a first plane different from the first and second conductive planes and positioned to face the first conductive plane, a second transmission line having an open end which is formed in a second plane different from the first and second conductive planes and positioned to face the second conductive plane, and a conductive via electrically connecting the first transmission line to the second transmission line.

In a fourth embodiment, the unit structure includes first and second conductive planes which are disposed in parallel with each other, a first transmission line which is formed in a first plane positioned between the first and second conductive planes so as to face the second conductive plane, a second transmission line having an open end which is formed in a second plane positioned to face the second conductive plane outside a region circumscribed between the first and second conductive planes, a third transmission line which is formed in a third plane positioned between the first conductive plane and the first transmission line so as to face the first conductive plane, a fourth transmission line having an open end which is formed in a fourth plane positioned to face the first conductive plane outside a region circumscribed between the first and second conductive planes, a first conductive via electrically connecting the first transmission line to the third transmission line, a second conductive via electrically connecting the first transmission line to the second transmission line, and a third conductive via electrically connecting the third transmission line to the fourth transmission line. In addition, a first clearance is formed at a first position corresponding to the third conductive via in the first conductive plane, which is thus electrically isolated from the third conductive via. Furthermore, a second clearance is formed at a second position corresponding to the second conductive via in the second conductive plane, which is thus electrically isolated from the second conductive via.

In a fifth embodiment, the unit structure includes first and second conductive planes which are disposed in parallel with each other, a first transmission line having an open end which is formed in a first plane different from the first and second conductive planes and positioned to face the first conductive plane, a second transmission line having an open end which is formed in a second plane different from the first and second conductive planes so as to face the second conductive plane, a first conductive via electrically connecting the second transmission line to the first conductive plane, and a second conductive via electrically connecting the first conductive plane to the second conductive plane. In addition, a first clearance is formed at a first position corresponding to the second conductive via in the first conductive plane, which is thus electrically isolated from the second conductive via. Furthermore, a second clearance is formed at a second position corresponding to the first conductive via in the second conductive plane, which is thus electrically isolated from the first conductive via.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF PREFERRED EMBODIMENTS

The present invention will be now described herein with reference to illustrative embodiments. Those skilled in the art will recognize that many alternative embodiments can be accomplished using the teachings of the present invention and that the invention is not limited to the embodiments illustrated for explanatory purposes.

In the following description regarding waveguide structures and printed-circuit boards according to the present invention with reference to the accompanying drawings, a vertical direction in FIG. 1 will be referred to as a thickness direction of a board.

1. First Embodiment

Figure 1:
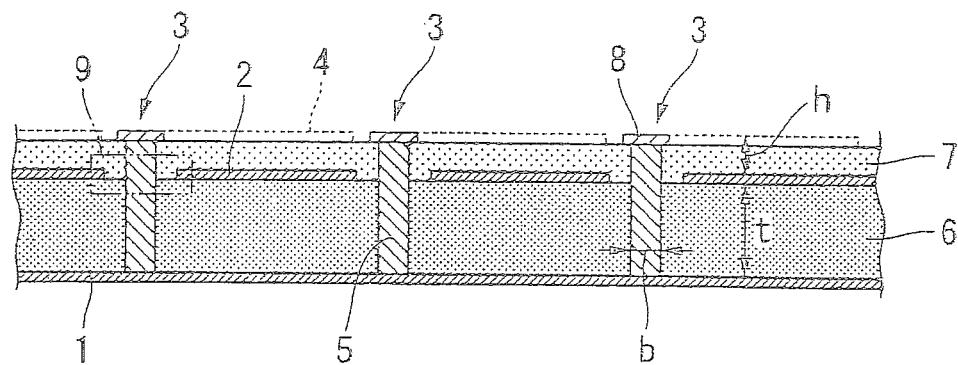
FIG. 1 is a cross-sectional view of an EBG structure used for explaining a waveguide structure according to a first embodiment of the present invention.
Figure 2:
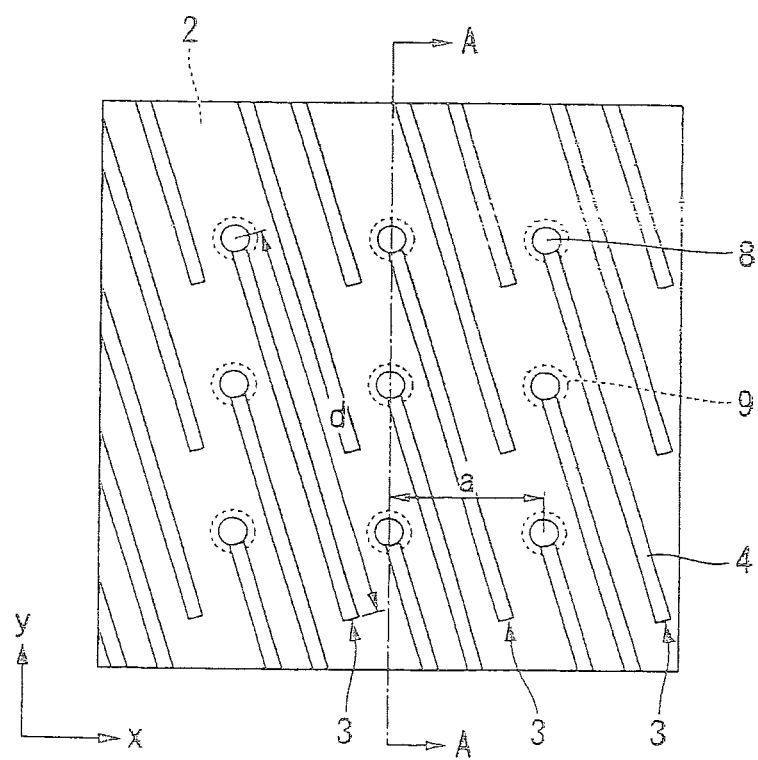
FIG. 2 is a plan view of the EBG structure corresponding to the waveguide structure of the first embodiment.

FIG. 1 is a cross-sectional view of an EBG structure according to a first embodiment. FIG. 2 is a plan view of the EBG structure, so that FIG. 1 is a cross-sectional view taken along line A-A in FIG. 1.

The EBG structure (or the waveguide structure) of the first embodiment is a parallel-plate conductive structure; as shown in FIG. 1, it includes first and second conductive planes 1 and 2, which are aligned in parallel with a distance therebetween in the thickness direction, as well as a unit structure 3. The unit structure 3 includes a transmission line 4, which is laid in a layer different from the layers of the first and second planes 1 and 2, and a conductive via 5 for electrically connecting the transmission line 4 and the first conductive plane 1.

Specifically, the EBG structure includes a first dielectric layer 6, and a second dielectric layer 7 which is deposited on an upper surface of the first dielectric layer 6 in the thickness direction, wherein the first conductive plane 1 is disposed on a lower surface of the first dielectric layer 6 in the thickness direction, and the second conductive plane 2 is disposed between the first dielectric layer 6 and the second dielectric layer 7. The conductive via 5 is elongated in the thickness direction from the upper surface of the second conductive plane 2 to the lower surface of the first conductive plane 1. The transmission line 4 is disposed on the upper surface of the second dielectric layer 7 in the thickness direction. That is, the transmission line 4 is disposed to face the first conductive plane 1 in the thickness direction with respect to the second conductive plane 2.

The transmission line 4 uses the second conductive plane 2 as a return path, wherein one end thereof (i.e. a right-side end in FIG. 1) serves as an open end so that the transmission line 4 serves as an open stub. The other end of the transmission line 4 (i.e. a left-side end in FIG. 1) is electrically connected to a pad 8 which is formed in the same plane as the transmission line 4 and which is electrically connected to the first conductive plane 1 via the conductive via 5 elongated in the thickness direction. The second conductive plane 2 is equipped with a clearance 9 which overlaps with the conductive via 5 in position, so that the conductive via 5 is electrically isolated from and is not brought into contact with the second conductive plane 2 by means of the clearance 9.

In the above EGB structure, the transmission line 4, the conductive via 5, and the pad 8 are devoted to an admittance, which is combined with the clearance 9 so as to form the unit structure 3. One or more unit structures 3 are repetitively aligned at a lattice point defined by an independent vector A=(A1,A2) and B=(B1,B2) on the X-Y plane. The first embodiment exemplarily refers to a tetragonal lattice defined by A=(a,0) and B=(0,a) shown in FIG. 2 as a basic-mode lattice point. In the first embodiment, the transmission line 4 is inclined to the tetragonal lattice of A=(a,0) and B=(0,a) by a certain angle, wherein it is possible to secure a long length d with respect to the transmission line 4 without interfering with the clearance 9 in its periphery. Strictly speaking, the transmission line 4 is not included in the cross section taken along line A-A in FIG. 2; for the sake of convenience, the transmission lines 4 are illustrated using dotted lines in FIG. 1. For the sake of convenience, FIG. 2 shows the second conductive plane 2 via the perspective scope of the second dielectric layer 7.

Next, a basic operating principle of the above EBG structure will be described.

Figure 3:
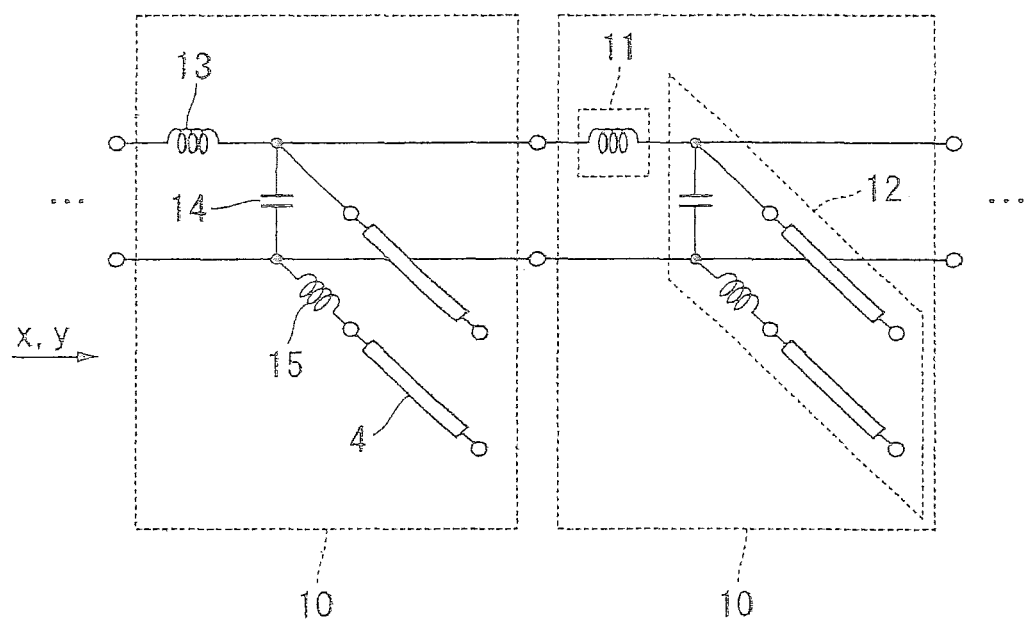
FIG. 3 is a circuit diagram showing an equivalent circuit of the EBG structure.
Figure 4:
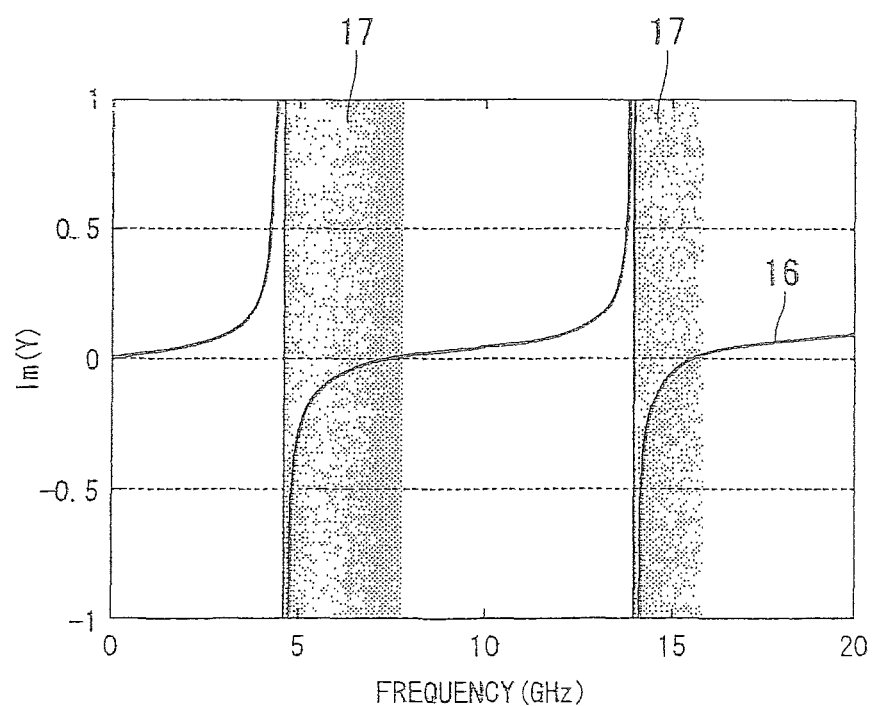
FIG. 4 is a graph plotting the imaginary part of admittance in the EBG structure.
Figure 5:
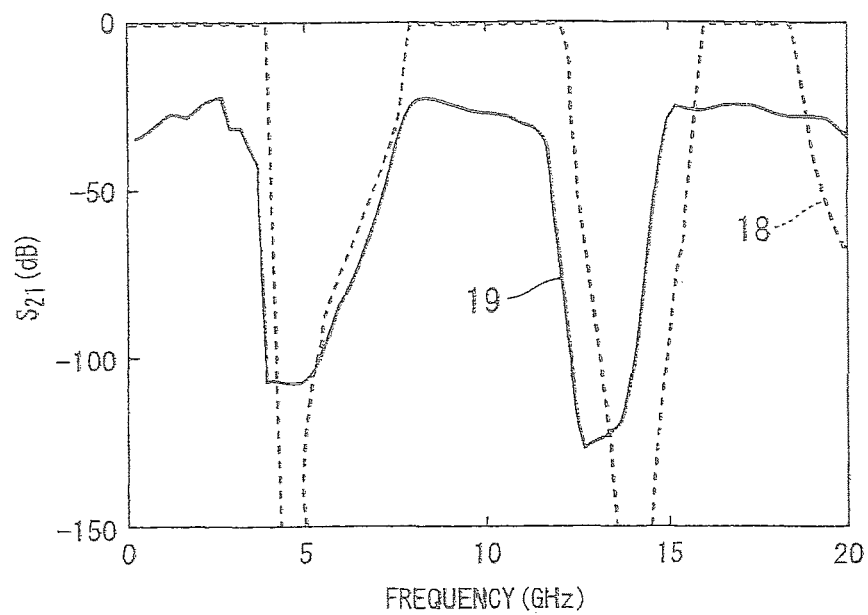
FIG. 5 is a graph showing calculation results regarding insertion loss in propagation of electromagnetic waves through the EBG structure.

FIG. 3 shows an equivalent circuit along the X-axis or Y-axis in FIG. 2. FIG. 4 is a graph for plotting the imaginary part of a parallel admittance. FIG. 5 is a graph showing calculation results regarding an insertion loss in propagation of electromagnetic waves through the EBG structure of the first embodiment.

Each repetitive unit 10 of the equivalent circuit shown in FIG. 3 is constituted of a serial impedance 11 and a parallel admittance 12. The serial impedance includes an inductance 13 formed between the first and second conductive planes 1 and 2. The parallel admittance 12 includes a capacitance 14 formed between the first and second conductive planes 1 and 2, an inductance 15 of the conductive via 5, and the transmission lines 4. The overall equivalent circuit of the EBG structure is formed by repetitively connecting one or more repetitive units 10.

In the EBG structure, band gaps occur in frequency bands in which the parallel admittances 12 serve as inductances. An admittance Y representative of the parallel admittance 12 is given by equation (1).

$$Y = \frac{1}{Z_{in} + i\omega L_{via}} + i\omega C_{plane} \quad (1)$$

Y: Admittance
$Z_{in}$: Input impedance of the transmission line 4 in view of the pad 8
$\omega$: Angular frequency
$L_{via}$: Inductance
$C_{plane}$: Capacitance The input impedance $Z_{in}$ of the transmission line 4 in view of the pad 8 is given by equation (2).

$$Z_{in} = Z_0 \times \frac{Z_T + iZ_0 \tan(\beta d)}{Z_0 + iZ_T \tan(\beta d)} \quad (2)$$

$$\beta = \omega \sqrt{\varepsilon_{eff} \varepsilon_0 \mu_0}$$

$Z_{in}$: Input impedance of the transmission line 4 in view of the pad 8
$Z_0$: Characteristic impedance
$Z_T$: Terminating resistance
d: Length of the transmission line
$\omega$: Angular frequency
$\varepsilon_{eff}$: Effective dielectric constant
$\varepsilon_0$: Dielectric constant of a vacuum
$\mu_0$: Magnetic permeability of a vacuum FIG. 4 shows frequency-dependent impedance curves 16 based on the imaginary part of the admittance Y calculated by equations (1) and (2) using parameters such as the capacitance 14 of 0.73 pF, the inductance 15 of 0.22 nH, the characteristic impedance of 20.25Ω of the transmission line 4, the length d=7.5 mm of the transmission line 4, and the effective dielectric constant $\varepsilon_{eff}$=3.47 of the transmission line 4. The transmission line 4 is of an open-end type so that the terminating resistance $Z_T$ thereof is presumed to be infinite. Due to an impedance-converting effect of the transmission line 4, the capacitive property (where Im(Y)>0) and the inductive property (where Im(Y)<0) alternately emerge in the impedance Im(Y) based on the admittance Y. In FIG. 4, the impedance Im(Y) becomes negative in frequency bands 17, thus showing the inductive property. For this reason, it is anticipated that band gaps may likely occur in the frequency bands 17.

When Equation (1) is modified to represent the function of length d of the transmission line by way of substitution in Equation (2), and by letting $Z_T$ to approach infinity as described above, the waveguide structure is thereby configured to suppress electromagnetic propagation between a power source and a ground plane at a frequency f satisfying an inequality Im(Y(f))≤0, where Im(Y(f)) is an imaginary component of a parallel admittance Y(f) defined as:

$$Y(f) = \frac{1}{i\left(2\pi f L_{via} - \frac{Z_0}{\tan(2\pi f \sqrt{\varepsilon_{eff} \varepsilon_0 \mu_0} \, d)}\right)} + i2\pi f C_{plane}$$

where f denotes frequency, i denotes an imaginary component meaning that $i^2=-1$, $L_{via}$ denotes an inductance of the conductive via, $C_{plane}$ denotes a capacitance between the power source and the ground plane, $Z_0$ denotes a characteristic impedance of the transmission line, d denotes a length of the transmission line, $\in_{\it{eff}}$ denotes an effective dielectric constant, $\in_0$ denotes a dielectric constant under vacuum, and $\mu_0$ denotes a magnetic permeability under vacuum.

In the EBG structure, a physical structure corresponding to the repetitive unit 10 of the equivalent circuit is repetitively aligned at the lattice point defined by a certain lattice distance "a" on the X-Y plane. Due to a repetitive boundary condition imposed on the repetitive unit 10 of the equivalent circuit shown in FIG. 3, it is necessary to calculate band gaps in consideration of the structural repetitiveness. FIG. 5 shows calculation results regarding an insertion loss (S21) in propagation of electromagnetic waves through the EBG structure by a distance of 7×a. A dotted curve 18 shown in FIG. 5 shows the calculation result which is produced by imposing the repetitive boundary condition on the repetitive unit 10 of the equivalent circuit while using the same parameters of circuit components used for producing calculation results of FIG. 4. A solid curve 19 shown in FIG. 5 shows the result of numerical calculation by way of three-dimensional electromagnetic analysis. A model subjected to electromagnetic analysis is designed with prescribed structural dimensions, such as the thickness t=400 μm of the first dielectric layer 6, the thickness h=60 μm of the second dielectric layer 7, the width b=300 μm of the conductive via 5, and the length d=7.5 mm of the transmission line 4. FIG. 5 shows that calculated band gaps of the equivalent circuit significantly match the result of electromagnetic analysis.

Calculated frequency bands of band gaps shown in FIG. 5 significantly match the frequency bands 17 shown in FIG. 4. This indicates that frequency bands of band gaps occurring in the EBG structure can be approximately illustrated by frequency characteristics of admittances. Since the admittance Y of the parallel admittance 12 is determined by equations (1) and (2), it is possible to bring band gaps into desired frequency bands by appropriately setting parameters of these equations. In particular, the length d of the transmission line 4 has a relatively high degree of freedom in designing; hence, it is possible to easily control band gaps by varying the length d. Frequencies of band gaps can be lowered by increasing the length d of the transmission line 4 but without necessarily changing its area; hence, it is possible to reduce the mounting area of the EBG structure. Since the EBG structure does not need chip components, it is possible to reduce the manufacturing cost in comparison with the conventional arts.

Figure 6:
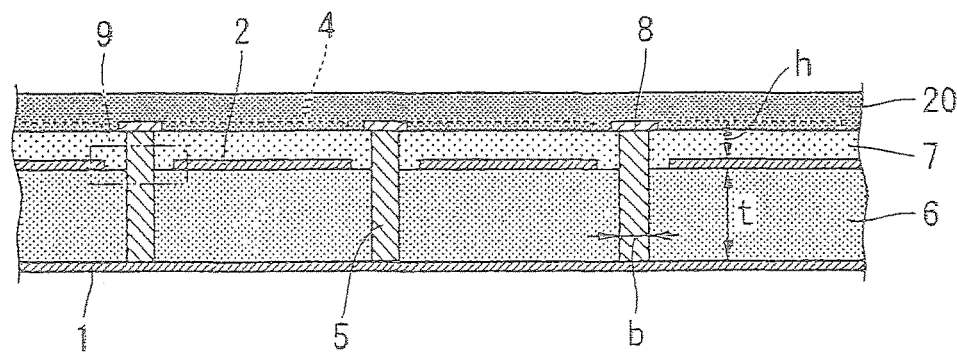
FIG. 6 is a cross-sectional view showing an EBG structure including an additional dielectric layer deposited above transmission lines.

First embodiment of FIG. 1 shows that no structure exists above the transmission lines 4, whereas it is possible to modify it such that a certain structure is mounted on the transmission lines 4. As shown in FIG. 6, for example, it is possible to arrange an additional dielectric layer (i.e. a third dielectric layer 20) above the transmission lines 4, thus increasing the effective dielectric constant of the transmission line 4. Equation (2) indicates that the impedance converting effect appears markedly on the transmission line 4 as the effective dielectric constant of the transmission line 4 becomes higher; hence, it is possible to lower the frequencies of band gaps without increasing the length d of the transmission line 4. For lowering frequencies of band gaps, it is preferable to use a dielectric material having a high dielectric constant for the third dielectric layer 20. Since it is unnecessary to lower the frequencies of band gaps, it is possible to use any type of dielectric materials for additional dielectric layers deposited above the transmission lines 4.

As long as one end of the transmission line 4 serves as an open end while the other end is connected to the pad 8, it is possible to employ any type of arrangements and shapes to the transmission lines 4, which do not affect the inherent property of the present invention.

Figure 7A:
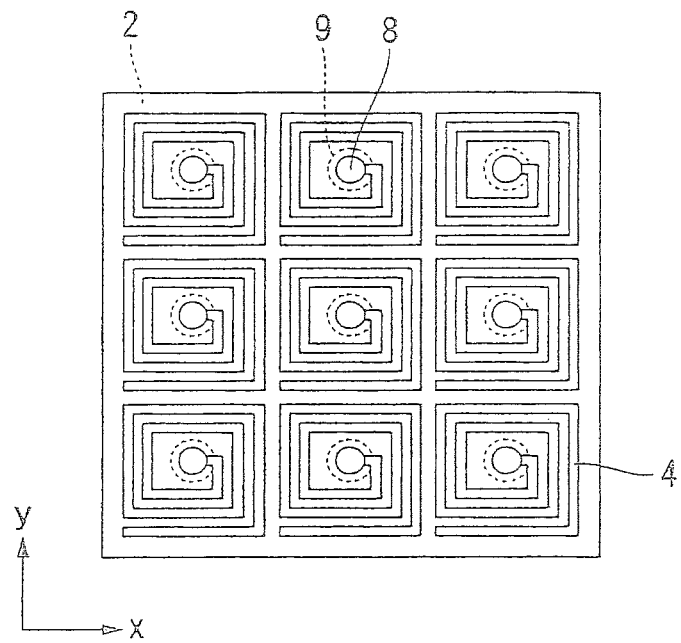
FIG. 7A is a plan view showing spiral-shaped transmission lines.
Figure 7B:
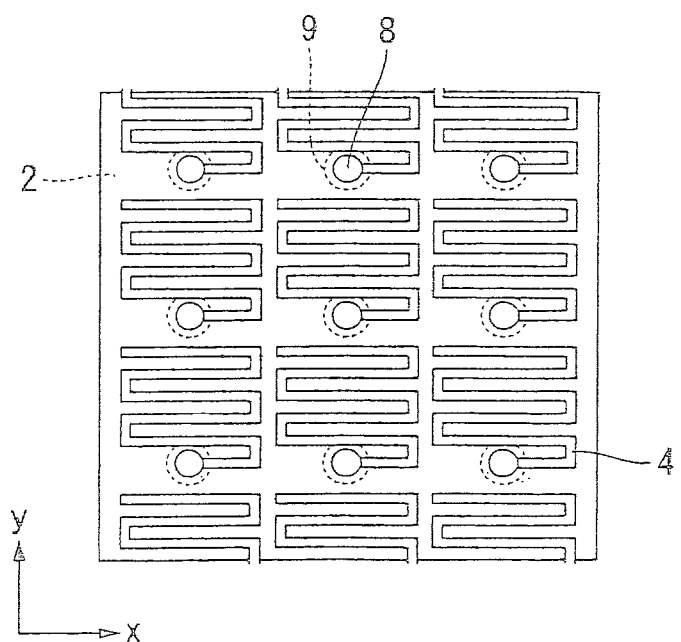
FIG. 7B is a plan view showing meandering transmission lines.

In the first embodiment, as shown in FIG. 2, the transmission lines 4 are inclined to the X-axis and Y-axis with certain angles therebetween so as not to interfere with the clearances 9 in their periphery, whereas they can be aligned in parallel with the X-axis and Y-axis without interference with the clearances 9. Although the first embodiment is designed such that the transmission lines 4 are linearly elongated as shown in FIG. 2, it is possible to employ the spiral shapes shown in FIG. 7A or the meandering shapes shown in FIG. 7B, for example. These examples adequately secure the length d of the transmission line 4 within a small mounting area.

Figure 8:
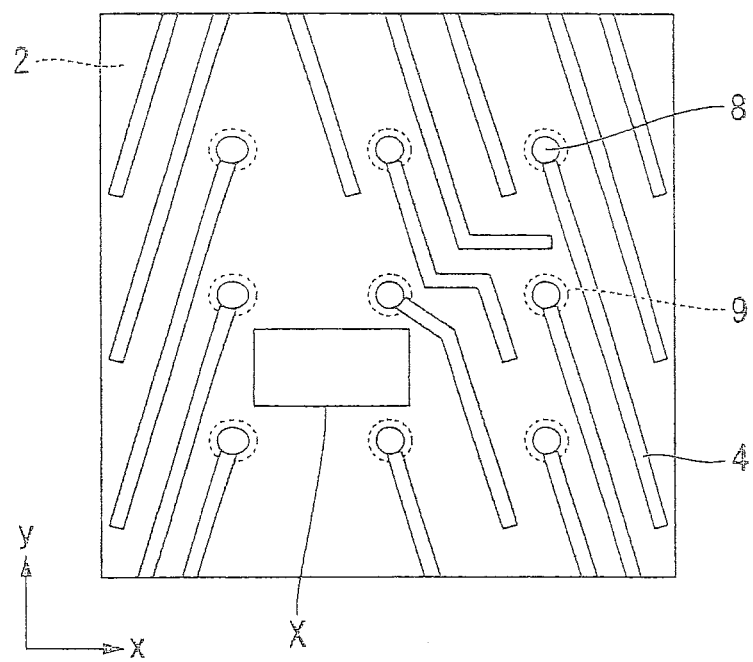
FIG. 8 is a plan view showing an EBG structure in which transmission lines are aligned to detour around a component X.

The transmission lines 4 are not necessarily aligned with the same arrangement and the same shapes shown in FIG. 2 in connection with all the unit structures 3. For example, it is possible to align the transmission lines 4 while avoiding a component X mounted on the surface as shown in FIG. 8, thus securing high-density packaging.

FIG. 2 shows the tetragonal lattice as the lattice point for repetitively aligning the unit structure 3; but this is not a restriction. For example, it is possible to employ triangular lattices or a one-dimensional repetitive alignment, thus demonstrating satisfactory effects.

For the sake of convenience in manufacturing, the pads 8 are aligned in connection with the transmission lines 4 and the conductive vias 5, whereas it is possible to modify the EBG structure not including the pads 8 without affecting the inherent properties of the present invention.

2. Second Embodiment

Next, a waveguide structure according to a second embodiment of the present invention will be described with reference to FIG. 9.

Figure 9:
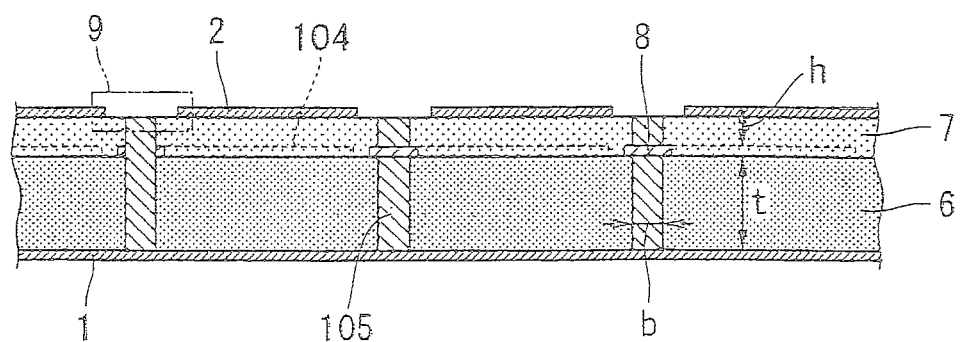
FIG. 9 is a cross-sectional view of an EBG structure used for explaining a waveguide structure according to a second embodiment of the present invention.

FIG. 9 is a cross-sectional view showing an EBG structure according to the second embodiment.

The EBG structure of the second embodiment is a variation of the EBG structure of the first embodiment, wherein parts identical to those of the first embodiment are designated by the same reference numerals, thus avoiding duplicate descriptions thereof.

The EGB structure of the second embodiment shown in FIG. 9 is characterized in that a transmission line 4 is embedded inside the region sandwiched between the first conductive plane 1 and the second conductive plane 2. Specifically, the first conductive plane 1 is attached to the lower surface of the first dielectric layer 6 in its thickness direction while the second conductive plane 2 is attached to the upper surface of the second dielectric layer 7 in its thickness direction in the EBG structure of the second embodiment. The transmission line 104 which uses the second conductive plane 2 as a return path is laid in the intermediate layer circumscribed between the first dielectric layer 6 and the second dielectric layer 7.

Similar to the transmission line 4 for use in the first embodiment, one end of the transmission line 104 is an open end, thus serving as an open stub. The other end of the transmission line 104 is connected to the pad 8 which is positioned in the same plane as the transmission line 104, wherein the pad 8 is electrically connected to the first conductive plane 1 via a conductive via 105. Similar to the first embodiment, the pad 8, the transmission line 104, and the conductive via 105 serve as an admittance, which is combined with the clearance arranged for the second conductive plane 2 so as to form the unit structure 3. The arrangement of the unit structure 3 as well as the arrangement and shape of the transmission line 104 employed in the second embodiment are similar to those employed in the first embodiment.

Since the transmission line 104 is shielded by the first and second conductive planes 1 and 2 in the EBG structure of the second embodiment, it is possible to reduce the number of unwanted electromagnetic waves being emitted from the transmission line 104 to the exterior surface.

Figure 10:
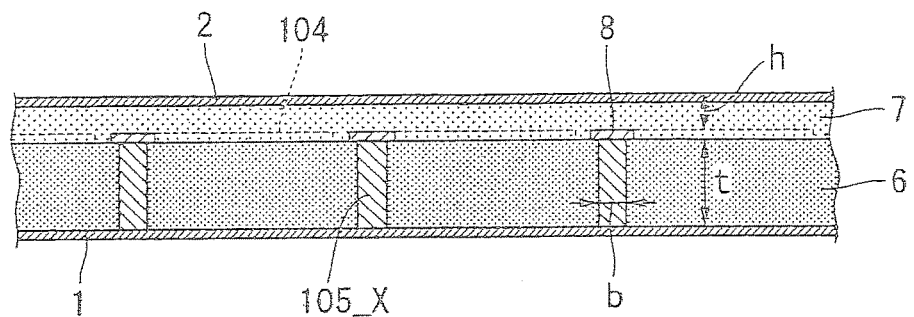
FIG. 10 is a cross-sectional view showing a variation of the EBG structure shown in FIG. 9.

FIG. 9 shows the second embodiment in which the conductive via 105 is a through-via; but this is not a restriction as long as the pad 8 is electrically connected to the first conductive plane 1. As shown in FIG. 10, for example, it is possible to arrange a conductive via 105_X of a non-through-via type without affecting the property of the present invention. Since the EBG structure shown in FIG. 10 does not need the clearance 9 for the second conductive plane 2, it is possible to eliminate electromagnetic waves from being emitted from the clearance 9 to the exterior surface.

3. Third Embodiment

Next, a waveguide structure according to a third embodiment of the present invention will be described with reference to FIG. 11.

Figure 11:
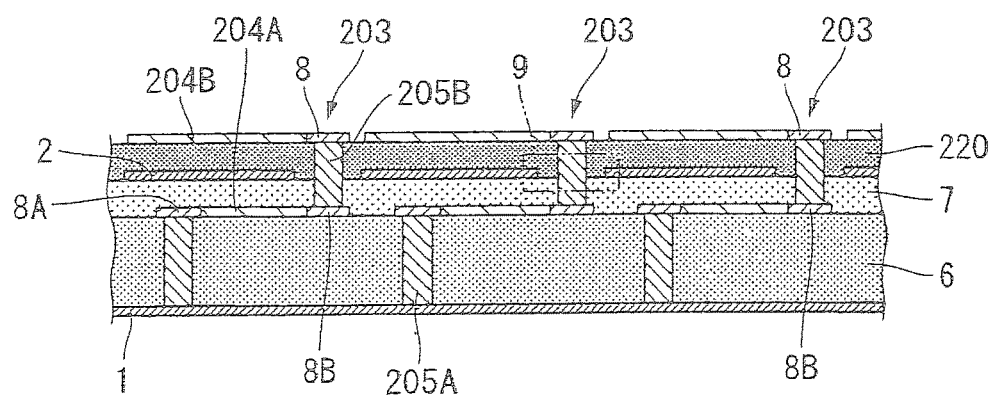
FIG. 11 is a cross-sectional view of an EBG structure used for explaining a waveguide structure according to a third embodiment of the present invention.

FIG. 11 is a cross-sectional view showing an EBG structure according to the third embodiment.

The EBG structure of the third embodiment is a variation of the EBG structure of the second embodiment, wherein parts identical to those of the second embodiment are designated by the same reference numerals, thus avoiding duplicate descriptions thereof.

The EBG structure of the third embodiment shown in FIG. 11 is formed using a unit structure 203 including a first transmission line 204A laid between the first conductive plane 1 and the second conductive plane 2, a second transmission line 204B positioned to face the second conductive plane 2 with respect to the first conductive plane 1, a first conductive via 205A for electrically connecting one end of the first transmission line 204A (i.e. a left-side end in FIG. 11) to the first conductive plane 1, and a second conductive via 205B for electrically connecting the other end of the first transmission line 204A (i.e. a right-side end in FIG. 11) to the second transmission line 204B.

Similar to the second embodiment, the third embodiment is designed such that the first conductive plane 1 is attached to the lower surface of the first dielectric layer 6 in its thickness direction while the second conductive plane 2 is attached to the upper surface of the second dielectric layer 7 in its thickness direction. A third dielectric layer (i.e. a surface dielectric layer 220) for covering the second conductive plane 2 is deposited on the upper surface of the second dielectric layer 7. The first transmission line 204A is aligned at the position of the transmission line 104 used in the second embodiment (i.e. the position between the first dielectric layer 6 and the second dielectric layer 7), while the second transmission line 204B whose one end is an open end is aligned on the upper surface of the surface dielectric layer 220 in its thickness direction. The first transmission line 204A uses the second conductive plane 2 as a return path, wherein pads 8A and 8B which are aligned in the same plane as the first transmission line 204A are electrically connected to the opposite ends of the first transmission line 204A. The second transmission line 204B uses the second conductive plane 2 as a return path, wherein one end of the second transmission line 204B is an open end, thus serving as an open stub. The other end of the second transmission line 204B is electrically connected to the pad 8 which is aligned in the same plane as the second transmission line 204B.

The pad 8A attached to the first transmission line 204A is electrically connected to the first conductive plane 1 via a first conductive via 205A which is elongated in the thickness direction. The pad 8B attached to the first transmission line 204A is electrically connected to the pad 8 attached to the second transmission line 204B via a second conductive via 205B which is elongated in the thickness direction. The clearance 9 is arranged for the second conductive plane 2 in connection with the second conductive via 205B, so that the second conductive plane 2 is electrically isolated from and is prevented from contacting the second conductive via 205B by means of the clearance 9.

Since the first transmission line 204A laid in the intermediate layer and the second transmission line 204B laid in the surface layer collectively serve as an open stub in the EBG structure of the third embodiment, it is possible to secure an adequate transmission-line length d within a small area in packaging.

Similar to the first and second embodiments, various patterns can be created in terms of the arrangement and shapes of the first and second transmission lines 204A and 204B. It is possible to employ spiral shapes or meandering shapes, for example. Thus, it is possible to produce the EBG structure which can be mounted on a small area in packaging.

Figure 12:
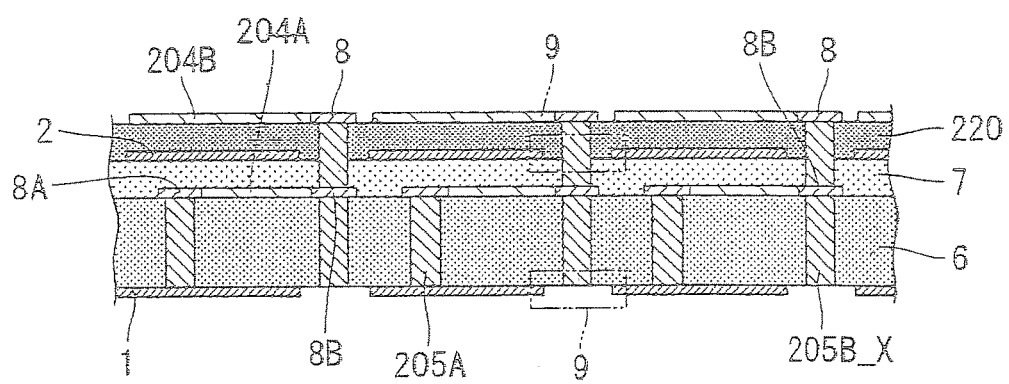
FIG. 12 is a cross-sectional view showing a variation of the EBG structure shown in FIG. 11.

FIG. 11 shows the third embodiment in which both the first and second conductive vias 205A and 205B are of a non-through-via type, whereas it is possible to use through vias. As shown in FIG. 12, for example, it is possible to replace the second conductive via 205B with another second conductive via 205B_X serving as a through via. In the EBG structure shown in FIG. 12, the clearance 9 is formed at a prescribed position corresponding to the second conductive via 205B_X in relation to the first conductive plane 1, thus preventing the first conductive plane 1 from being electrically connected to the second conductive plane 2. In addition, it is possible to use a through via as the first conductive via 205A.

4. Fourth Embodiment

Next, a waveguide structure according to a fourth embodiment of the present invention will be described with reference to FIG. 13.

Figure 13:
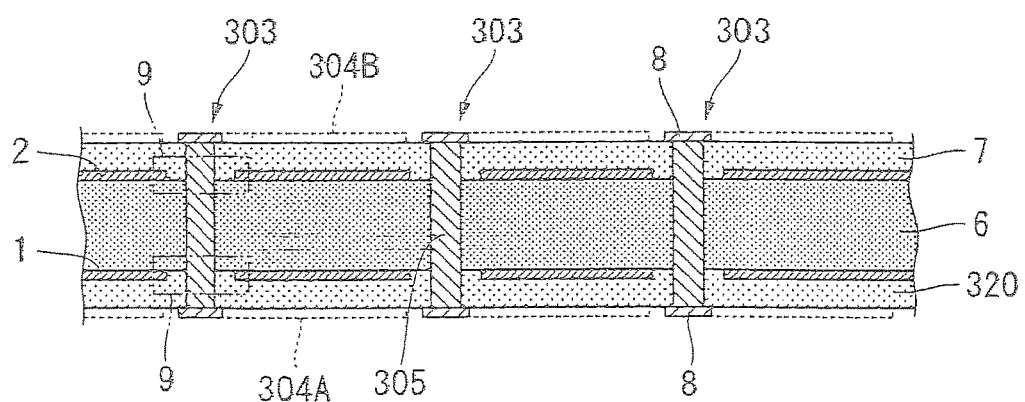
FIG. 13 is a cross-sectional view of an EBG structure used for explaining a waveguide structure according to a fourth embodiment of the present invention.

FIG. 13 is a cross-sectional view showing an EBG structure according to the fourth embodiment.

The EBG structure of the fourth embodiment is a variation of the EBG structure of the first embodiment, wherein parts identical to those used in the first embodiment are designated by the same reference numerals, thus avoiding duplicate descriptions thereof.

In contrast to the EBG structure of the first, second, and third embodiments in which the transmission lines 4, 104, 204A, and 204B are aligned in proximity to only the second conductive plane 2 within the first and second conductive planes 1 and 2 and are each configured to use the second conductive plane 2 as a return path, the fourth embodiment is characterized in that transmission lines 304A and 304B are arranged for the first and second conductive planes 1 and 2 respectively. That is, the EBG structure of the fourth embodiment is mirror-plane symmetrical to the EBG structure of the first embodiment in the vertical direction. As shown in FIG. 13, it is formed using a unit structure 303 including the first transmission line 304A which is laid in the layer different from the layers of the first and second conductive planes 1 and 2 and which uses the first conductive plane 1 as a return path, the second transmission line 304B which is laid in the layer different from the layers of the first and second conductive planes 1 and 2 and which uses the second conductive plane 2 as a return path, and a conductive via 305 for electrically connecting the prescribed ends of the transmission lines 304A and 304B together.

Specifically, the fourth embodiment is designed in such a manner similar to the first embodiment that the first conductive plane 1 is aligned on the lower surface of the first dielectric layer 6 in its thickness direction while the second conductive plane 2 is inserted between the first dielectric layer 6 and the second dielectric layer 7. A third dielectric layer (i.e. a backside dielectric layer 320) for covering the first conductive plane 1 is deposited on the lower surface of the first dielectric layer 6 in its thickness direction. In addition, the first transmission line 304A is aligned on the lower surface of the backside dielectric layer 320 in its thickness direction, while the second transmission line 304B is aligned on the surface of the second dielectric layer 7 in its thickness direction. That is, the first and second transmission lines 304A and 304B are positioned outside the region sandwiched between the first and second conductive planes 1 and 2.

Open ends are formed at one end of the first transmission line 304A (i.e. a right-side end in FIG. 13) and one end of the second transmission line 304B, so that the first and second transmission lines 304A and 304B serve as open stubs. The pads 8 which are formed in the same planes as the first and second transmission lines 304A and 304B are electrically connected to the other end of the first transmission line 304A (i.e. a left-side end in FIG. 13) and the other end of the second transmission line 304B. The pad 8 attached to the first transmission line 304A is electrically connected to the pad 8 attached to the second transmission line 304B via a conductive via 305 which is elongated in the thickness direction. The clearances 9 are formed at the positions corresponding to the opposite ends of the conductive via 305 in proximity to the first and second conductive planes 1 and 2, which are thus electrically isolated from each other and are not brought into contact with each other via the clearances 9.

Figure 14:
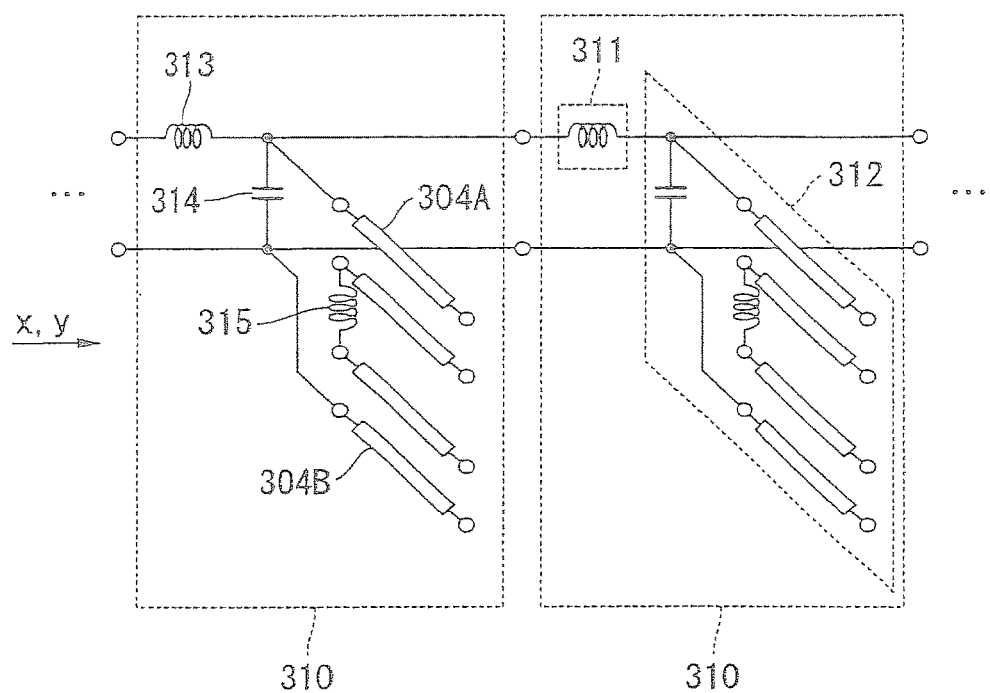
FIG. 14 is a circuit diagram showing an equivalent circuit of the EBG structure shown in FIG. 13.

FIG. 14 is a circuit diagram showing an equivalent circuit of the EBG structure of the fourth embodiment.

A repetitive unit 310 of the equivalent circuit shown in FIG. 14 is constituted of a serial impedance 311 and a parallel admittance 312. Similar to the first embodiment, the serial impedance 311 is composed of an inductance 13 formed between the first and second conductive planes 1 and 2. The parallel admittance 312 is constituted of a capacitance 314 formed between the first and second conductive planes 1 and 2, and an inductance 315 of the conductive via 305, as well as the first and second transmission lines 304A and 304B. The parallel admittance 312 used in the fourth embodiment is designed such that the open stub of the second transmission line 304B is additionally connected in series with the parallel admittance 12 used in the first embodiment. Similar to the first embodiment, the fourth embodiment is characterized in that band gaps occur in frequency bands in which the parallel admittance 312 becomes negative.

The EBG structure of the fourth embodiment is mirror-plane symmetrical to the EBG structure of the first embodiment in the vertical direction. Instead, it can be reconfigured in a manner mirror-plane symmetrical to the EBG structure of the second or third embodiment in the vertical direction.

Figure 15:
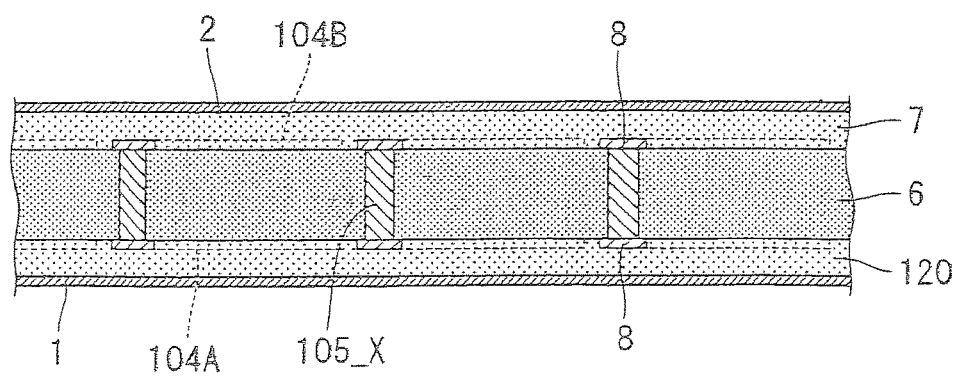
FIG. 15 is a cross-sectional view showing a first variation of the fourth embodiment which is created based on the EBG structure of the second embodiment.

Specifically, it is possible to create an EBG structure shown in FIG. 15 based on the EBG structure of the second embodiment, wherein a third dielectric layer 120 is inserted between the first conductive plane 1 and the first dielectric layer 6; a first transmission line 104A which uses the first conductive plane 1 as a return path is aligned between the first dielectric layer 6 and the third dielectric layer 120; and a second transmission line 104B which uses the second conductive plane 2 as a return path is aligned between the first dielectric layer 6 and the second dielectric layer 7. Open ends are formed at one end of the first transmission line 104A and one end of the second transmission line 104B, while the pads 8 are electrically connected to the other ends of the transmission lines 104A and 104B. The pads 8 attached to the first and second transmission lines 104A and 104B are electrically connected together via a conductive via 105_X of a non-through-via type.

Figure 16:
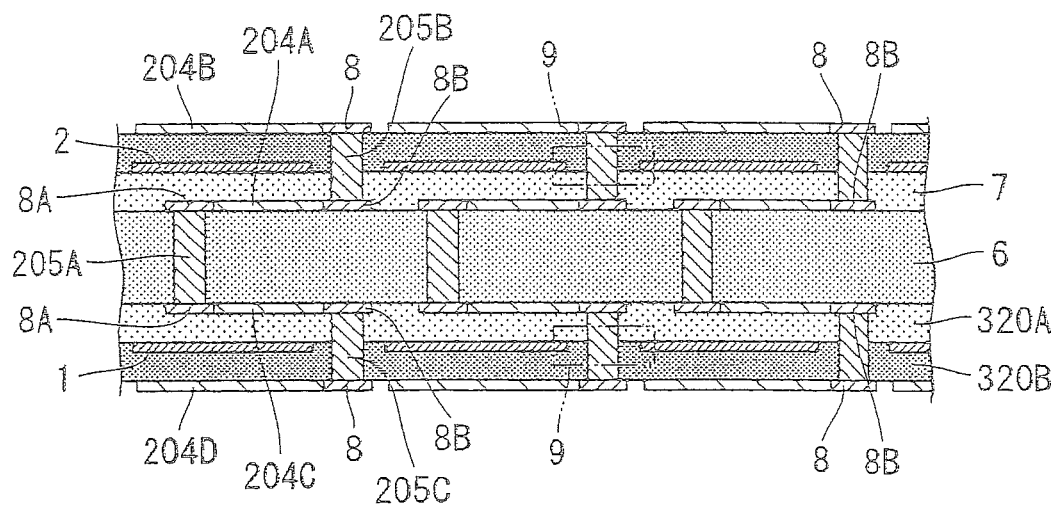
FIG. 16 is a cross-sectional view showing a second variation of the fourth embodiment which is created based on the EBG structure of the third embodiment.

It is possible to create an EBG structure shown in FIG. 16 based on the EBG structure of the third embodiment, wherein a third dielectric layer 320A is inserted between the first conductive plane 1 and the first dielectric layer 6, and a backside dielectric layer 320B for covering the first conductive plane 1 is deposited on the lower surface of the third dielectric layer 320A in its thickness direction. In addition, a third transmission line 204C which uses the first conductive plane 1 as a return path is laid between the first conductive plane 1 and the first transmission line 204A, in other words, between the first dielectric layer 6 and the third dielectric layer 320A. Furthermore, a fourth transmission line 204D which uses the first conductive plane 1 as a return path is positioned to face the first conductive plane 1 outside a region circumscribed between the first conductive plane 1 and the second conductive plane 2, in other words, it is aligned on the lower surface of the backside dielectric layer 320B in its thickness direction. The pads 8A and 8B which are formed in the same plane as the third transmission line 204C are electrically connected to the opposite ends of the third transmission line 204C. One end of the fourth transmission line 204D is an open end, and the pad 8 which is formed in the same plane as the fourth transmission line 204D is electrically connected to the other end of the fourth transmission line 204D.

The pad 8A attached to the first transmission line 204A is electrically connected to the pad 8A attached to the third transmission line 204C via the first conductive via 205A which is elongated in the thickness direction. The pad 8B attached to the third transmission line 204C is electrically connected to the pad 8 attached to the fourth transmission line 204D via a third conductive via 205C which is elongated in the thickness direction. The clearance 9 is formed at a prescribed position corresponding to the third conductive via 205C in proximity to the first conductive plane 1; hence, the first conductive plane 1 is electrically isolated from and is prevented from contacting the third conductive via 205C by means of the clearance 9.

All the EBG structures shown in FIGS. 13, 15, and 16 are designed in a mirror-plane symmetrical manner in the vertical direction; but this is not a restriction. It is possible to create an asymmetrical structure in which the first transmission line 304A has a linear shape while the second transmission line 304B has a spiral shape, for example. It is possible to make the second dielectric layer 7 differ from the backside dielectric layer 320 in thickness. In this case, it is noticed that the effective dielectric constant of the first transmission line 304A should differ from the effective dielectric constant of the second transmission line 304B.

5. Fifth Embodiment

Next, a waveguide structure according to a fifth embodiment of the present invention will be described with reference to FIGS. 17 and 18.

Figure 17:
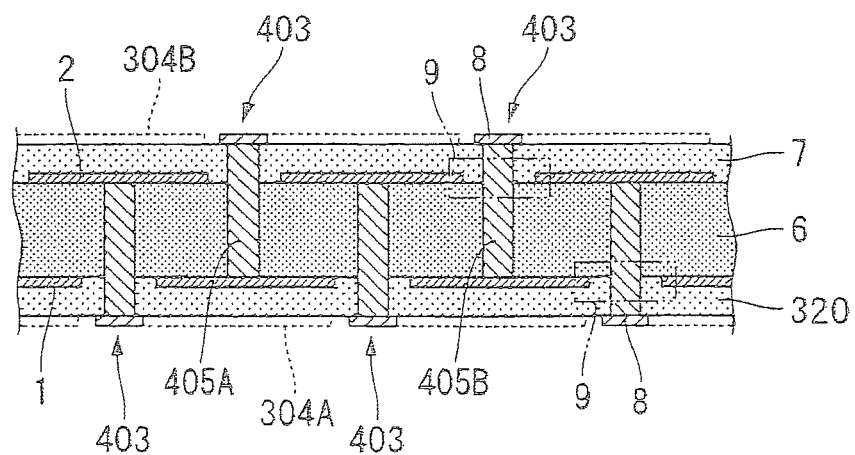
FIG. 17 is a cross-sectional view of an EBG structure used for explaining a waveguide structure according to a fifth embodiment of the present invention.

FIG. 17 is a cross-sectional view of an EBG structure according to the fifth embodiment. FIG. 18 is a plan view of the EBG structure, so that FIG. 17 is a cross-sectional view taken along line B-B in FIG. 17.

The EBG structure of the fifth embodiment is a variation of the EBG structure of the fourth embodiment, wherein parts identical to those of the fourth embodiment are designated by the same reference numerals, thus avoiding duplicate descriptions thereof.

In contrast to the EBG structure of the fourth embodiment shown in FIG. 13 in which the first transmission line 304A which uses the first conductive plane 1 as a return path is electrically connected to the second transmission line 304B which uses the second conductive plane 2 as a return path via the conductive via 305, the EBG structure of the fifth embodiment shown in FIG. 17 is designed such that the second transmission line 304B which uses the second conductive plane 2 as a return path is electrically connected to the first conductive plane 1 via a first conductive via 405A, while the first transmission line 304A which uses the first conductive plane 1 as a return path is electrically connected to the second conductive plane 2 as a second conductive via 405B. That is, the fifth embodiment is formed using a unit structure 403 including the first conductive via 405A for electrically connecting the first conductive plane 1 to the second transmission line 304B, and the second conductive via 405B for electrically connecting the second conductive plane 2 to the first transmission line 304A.

Specifically, the fifth embodiment is designed in such a manner similar to the fourth embodiment that the backside dielectric layer 320 is deposited on the lower surface of the first dielectric layer 6 in its thickness direction; the first conductive plane 1 is inserted between the first dielectric layer 6 and the backside dielectric layer 320; and the second conductive plane 2 is inserted between the first dielectric layer 6 and the second dielectric layer 7.

In addition, the first transmission line 304A is aligned on the lower surface of the backside dielectric layer 320 in its thickness direction, while the second transmission line 304B is aligned on the upper surface of the second dielectric layer 7 in its thickness direction.

The pads 8 are electrically connected to the left-side ends of the first and second transmission lines 304A and 304B. In a plan view, the pad 8 attached to the first transmission line 304A is shifted in position from the pad 8 attached to the second transmission line 304B. In addition, the pad 8 attached to the second transmission line 304B is electrically connected to the first conductive plane 1 via the first conductive via 405A, while the pad 8 attached to the first transmission line 304A is electrically connected to the second conductive plane 2. That is, a first admittance is formed by the first transmission line 304A, the pad 8, and the second conductive via 405B, while a second admittance is formed by the second transmission line 304B, the pad 8, and the first conductive via 405A. In a plan view of FIG. 18, the second admittance is formed at the position corresponding the first admittance subjected to parallel translation by A/2+B/2=(a/2,a/2) and further subjected to vertical inversion on the X-Y plane.

Figure 18:
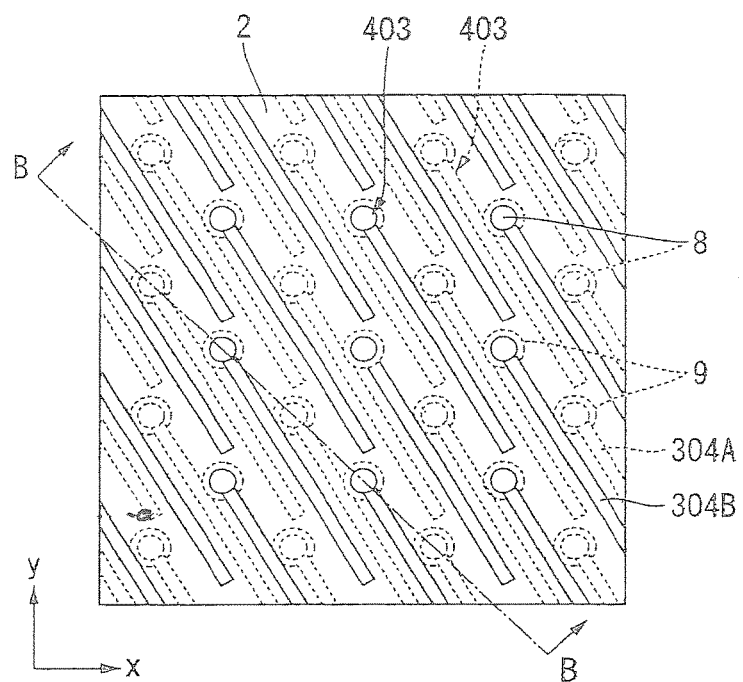
FIG. 18 is a plan view of the EBG structure shown in FIG. 17.

The EBG structure of the fifth embodiment makes it possible to locate the admittances with a high density in a plan view of FIG. 18; hence, it is possible to reduce the area of the EBG structure in packaging.

The EBG structure of the fifth embodiment is a variation of the EBG structure shown in FIG. 13, wherein it can be modified in a manner similar to the EBG structure shown in FIG. 15.

Figure 19:
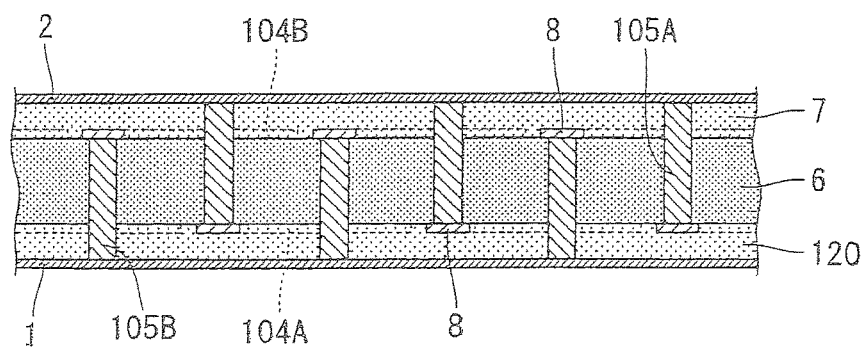
FIG. 19 is a cross-sectional view showing a variation of the fifth embodiment which is crated based on the EBG structure shown in FIG. 15.

Specifically, the EBG structure shown in FIG. 19 is created based on the EBG structure shown in FIG. 15, wherein the second transmission line 104B which uses the second conductive plane 2 as a return path is electrically connected to the first conductive plane 1 via a first conductive via 105A, and the first transmission line 104A which uses the first conductive plane 1 as a return path is electrically connected to the second conductive plane 2 via a second conductive via 105B.

In addition, it is possible to create an asymmetrical structure in which one of first and second transmission lines is aligned inside the region between the first and second conductive plane 1 and 2, and the other is aligned outside the region, wherein the second transmission line is electrically connected to the first conductive plane 1 via a first conductive via, and the first transmission line is electrically connected to the second conductive plane 2 via a second conductive via.

Figure 20:
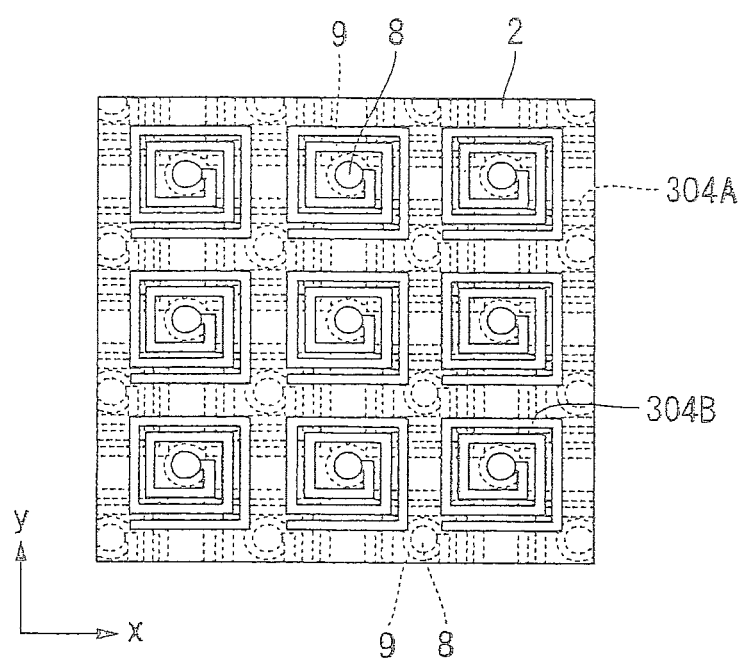
FIG. 20 is a plan view showing another variation of the fifth embodiment including spiral-shaped transmission lines.

FIG. 18 shows the fifth embodiment including the first and second transmission lines 304A and 304B both having linear shapes, which can be varied in various manners similar to the foregoing embodiments. For example, it is possible to employ spiral shapes as shown in FIG. 20.

Both the first and second transmission lines 304A and 304B are not necessarily formed in the same shape; hence, it is possible to create combinations in which one transmission line has a linear shape while another transmission line has a spiral shape, for example.

The fifth embodiment is not necessarily applied to the tetragonal lattice and is thus applicable to other types of lattices as well.

6. Sixth Embodiment

Next, a sixth embodiment of the present invention will be described with respect to a printed-circuit board with reference to FIGS. 21 and 22.

Figure 21:
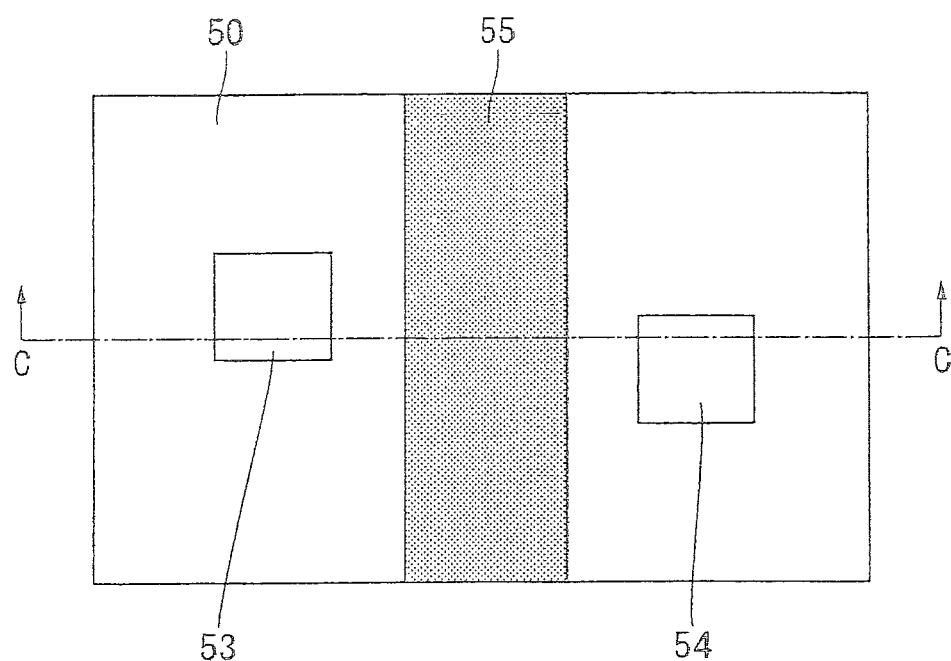
FIG. 21 is a plan view showing a printed-circuit board incorporating the EBG structure according to a sixth embodiment of the present invention.
Figure 22:
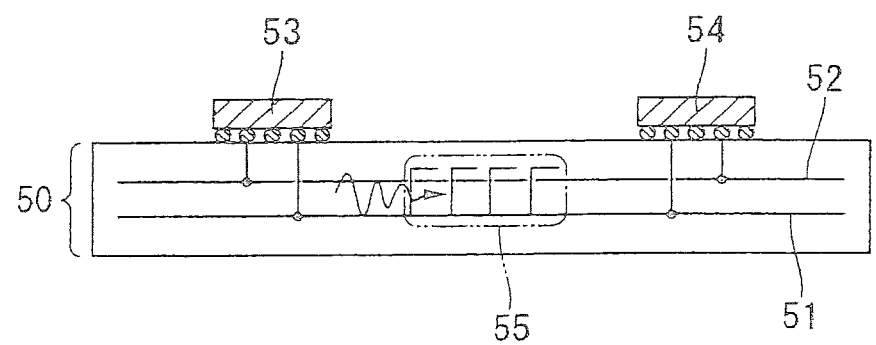
FIG. 22 is a cross-sectional view of the printed-circuit board shown in FIG. 21.

FIG. 21 is a plan view of the printed-circuit board according to the sixth embodiment, and FIG. 22 is a cross-sectional view taken along line C-C in FIG. 21.

The sixth embodiment is directed to a printed-circuit board 50 incorporating the aforementioned EBG structure. Specifically, the printed-circuit board 50 shown in FIGS. 21 and 22 includes a ground plane 51, a power-supply plane 52, a device 53 serving as a noise source, a device 54 sensitive to noise, and an EBG region 55 laid between the devices 53 and 54. As shown in FIG. 22, both the device 53 serving as the noise source and the device 54 sensitive to noise are connected to the ground plane 51 and the power-supply plane 52. The ground plane 51 and the power-supply plane 52 form a parallel-plate waveguide. In conventional printed-circuit boards, noises generated by noise-source devices propagate through parallel-plate waveguides so as to affect noise-sensitive devices, thus causing operational errors. The printed-circuit board 50 of the sixth embodiment shown in FIG. 21 is characterized in that the EBG region 55 corresponding to the aforementioned EBG structure is disposed to cut off a noise propagation path, thus suppressing propagation of noise between the devices 53 and 54. Thus, it is possible to reduce operational error occurring in the noise-sensitive device 54.

The printed-circuit board 50 of FIG. 22 employs the EBG structure of the first embodiment, which can be replaced with the EBG structures of the other embodiments.

Figure 23:
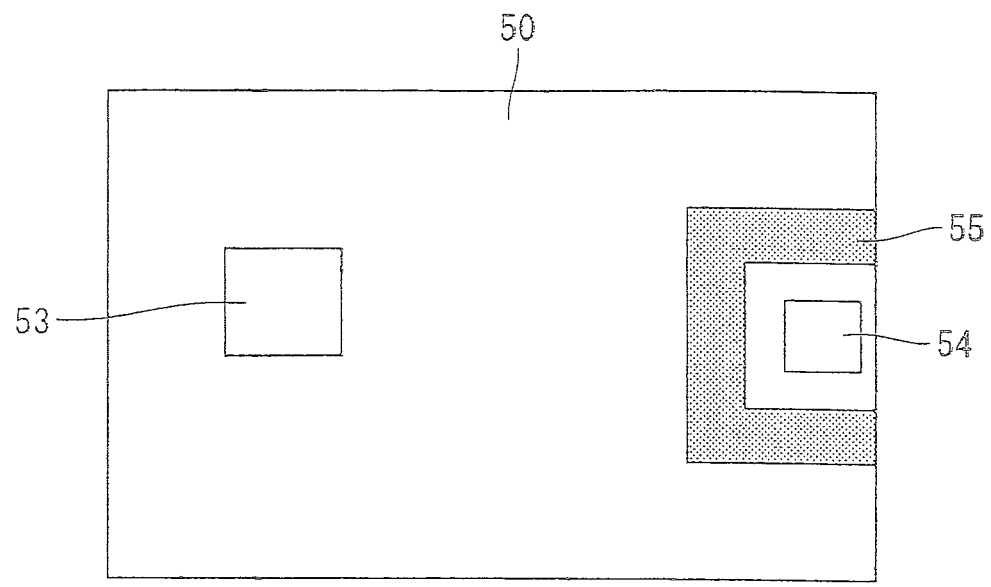
FIG. 23 is a plan view showing a variation of the sixth embodiment.

FIG. 21 shows that the EBG region 55 is arranged in a band shape; however, it is possible to employ any type of arrangements which can cut out the noise propagation path. It is possible to arrange the EBG structure surrounding the noise-sensitive device 54 as shown in FIG. 23.

The sixth embodiment is directed to the EBG structure installed in the printed-circuit board 50; but this is not a restriction. It is possible to install the aforementioned EBG structure in package substrates of devices or the like.

7. Seventh Embodiment

Next, a printed-circuit board according to a seventh embodiment of the present invention will be described with reference to FIG. 24.

Figure 24:
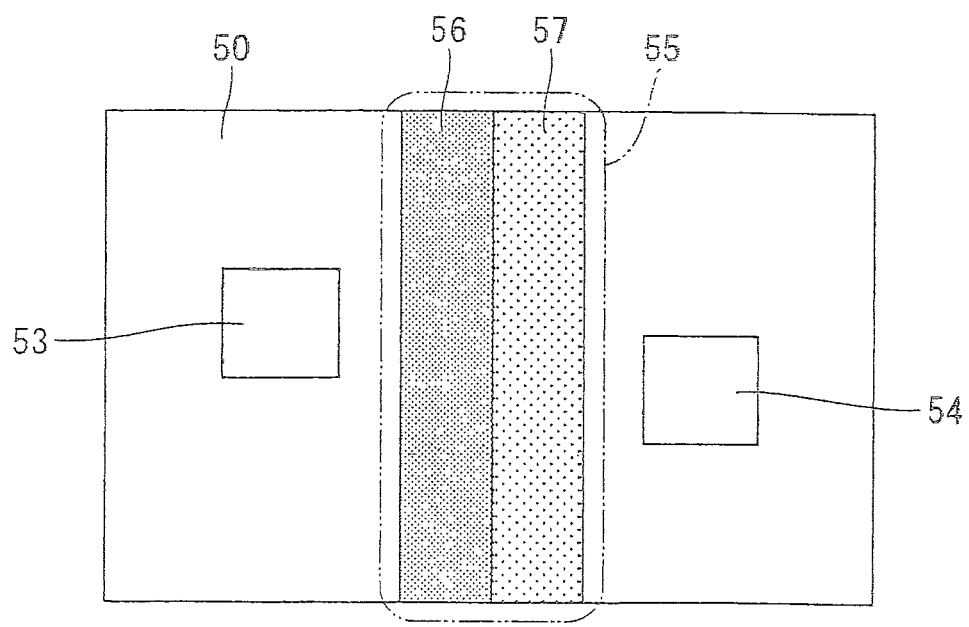
FIG. 24 is a plan view showing a printed-circuit board according to a seventh embodiment of the present invention.

FIG. 24 is a plan view of the printed-circuit board 50 according to the seventh embodiment, wherein parts identical to those of the sixth embodiment are designated by the same reference numerals, thus avoiding duplicate descriptions thereof.

The printed-circuit board 50 of the seventh embodiment includes a plurality of waveguide structures using open-end transmission lines having different lengths, wherein these waveguide structures are shifted in terms of band gaps.

Similar to the sixth embodiment, the printed-circuit board 50 of the seventh embodiment includes the ground plane 51, the power-supply plane 52, the device 53 serving as a noise source, and the noise-sensitive device 54. The seventh embodiment is characterized in that a first EBG structure 56 and a second EBG structure 57 are formed in the EBG region for cutting off the noise propagation path, thus suppressing propagation of noise between the devices 53 and 54. Herein, the first EBG structure 56 and the second EBG structure 57 are aligned in parallel in the noise propagation direction. The first EBG structure 56 and the second EBG structure 57 use respective open-stub transmission lines of different lengths so that they differ from each other in terms of frequency bands of band gaps. The lengths of transmission lines are set in such a way that band gaps cause by the first EBG structure 56 are deviated from band gaps caused by the second EBG structure 57; thus, it is possible to achieve "broad" band gaps, which cannot be obtained by a single EBG structure, by way of the EBG region 55.

Figure 25:
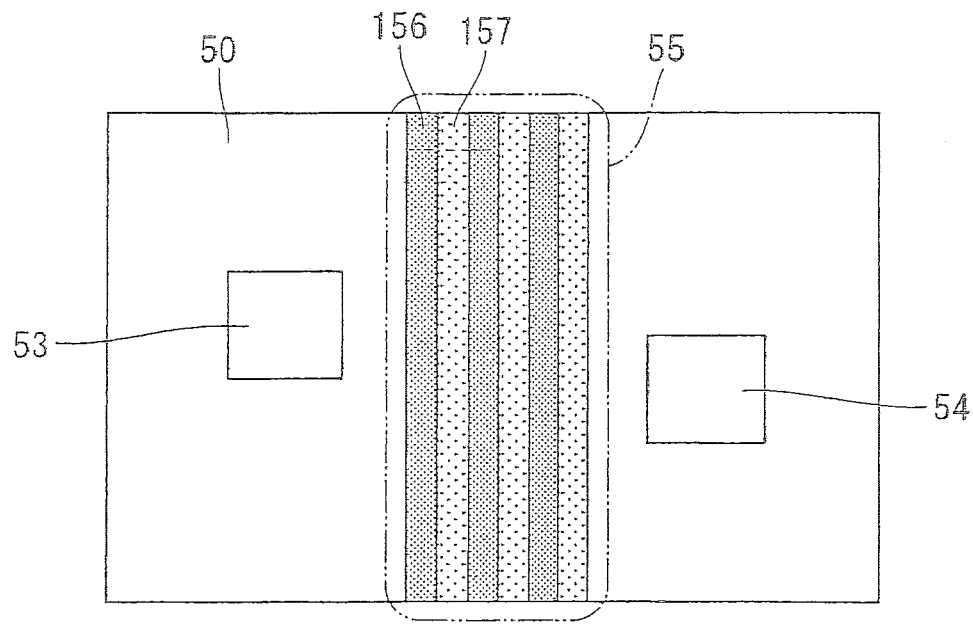
FIG. 25 is a plan view showing a first variation of the seventh embodiment in which two types of EBG structures are alternately aligned in the noise propagation direction.

FIG. 25 shows a first variation of the seventh embodiment in which first EBG structures 156 and second EBG structures 157 are alternately aligned in a stripe manner in the noise propagation direction.

Figure 26:
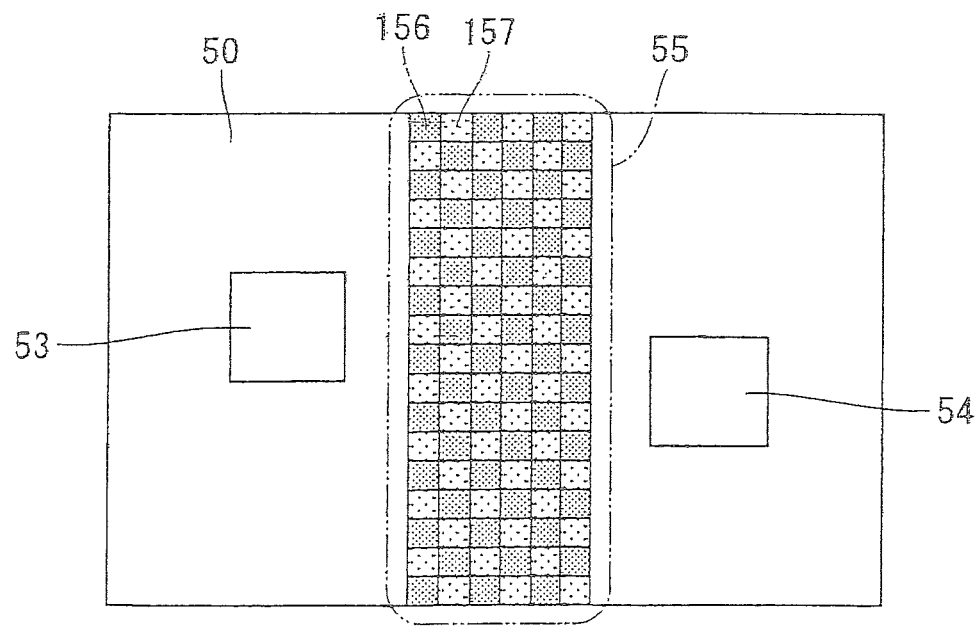
FIG. 26 is a plan view showing a second variation of the seventh embodiment in which two types of EBG structures are aligned in a checkered pattern.

FIG. 26 shows a second variation of the seventh embodiment in which the first EBG structures 156 and the second EBG structures 157 in a checkered pattern (or in checkers).

Both variations of the seventh embodiment achieve broad band gaps with the EBG region 55.

In this connection, it is possible to employ other types of arrangements in which the first and second EBG structures are intermixed together. Band gaps can be further enlarged by intermixing various types of EBG structures with deviated band gaps.

Lastly, it is apparent that the present invention is not limited to the above embodiments, but may be modified and changed without departing from the scope and spirit of the invention.

What is claimed is:

1. A waveguide structure, comprising:
   a first conductive plane formed as a predetermined area;
   a second conductive plane formed in parallel with the first conductive plane; and
   a plurality of unit structures, each of which includes:
      a transmission line having a first end serving as an open end and a second end, the transmission line having a thin and elongated shape being formed in a different layer than the first conductive plane and the second conductive plane and being positioned relatively close to the second conductive plane; and
      a conductive via electrically connecting the second end of the transmission line to the first conductive plane,
   wherein the unit structures are repetitively aligned in a one-dimensional manner or in a two-dimensional manner over the predetermined area, and
   wherein a distance between the transmission line and the second conductive plane is smaller than a distance between the transmission line and the first conductive plane.

2. The waveguide structure according to claim 1, the transmission line having a straight, curved, or polygonal shape that is coupled with the conductive via, thereby forming a microstrip line that uses the second conductive plane as a return path.

3. The waveguide structure according to claim 2, wherein at least a majority of a plurality of the transmission lines included in the plurality of unit structures have a straight-linear shape which is elongated in a plan view and inclined to a reference line connecting between a plurality of conductive vias included in the plurality of unit structures, which are positioned adjacent to each other, at a prescribed angle.

4. The waveguide structure according to claim 2, wherein substantially all of the unit structures each comprises a transmission line having the thin-and-elongated shape with a single portion, as configured to be oriented in a common single direction.

5. The waveguide structure according to claim 4, as configured so that a length of the thin shape serves as a design parameter for controlling a band gap of the waveguide structure without changing an area of the thin shape.

6. The waveguide structure according to claim 1, wherein the transmission line is positioned to face the second conductive plane outside a region interposed between the first and second conductive planes, and wherein a clearance is formed at a prescribed position proximate to the conductive via in the second conductive plane, thus electrically isolating the second conductive plane from the conductive via.

7. The waveguide structure according to claim 6, wherein the transmission line is covered with a dielectric layer.

8. The waveguide structure according to claim 1, wherein the transmission line is formed inside a region circumscribed between the first conductive plane and the second conductive plane.

9. The waveguide structure according to claim 1, wherein the transmission line comprises a first transmission line located inside a region circumscribed between the first conductive plane and the second conductive plane, and wherein the conductive via comprises a first conductive via, the waveguide structure further comprising:

a second transmission line having an open end laid on a second plane, which is positioned to face the second conductive plane outside the region circumscribed between the first and second conductive planes; and a second conductive via electrically connecting the first transmission line to the second transmission line, wherein a clearance is formed at a prescribed position corresponding to the second conductive via in the second conductive plane, which is thus electrically isolated from the second conductive via.

10. The waveguide structure according to claim 9, wherein each of the first transmission line coupled with the first conductive via and the second transmission line coupled with the second conductive via forms a microstrip line using the second conductive plane as a return path, and wherein each transmission line has one open end and the other end connected to its conductive via.

11. The waveguide structure according to claim 1, wherein the transmission line comprises a first transmission line located inside a region circumscribed between the first conductive plane and the second conductive plane, and wherein the conductive via comprises a first conductive via, the waveguide structure further comprising:

a second transmission line having an open end laid on a second plane, which is positioned to face the second conductive plane inside the region circumscribed between the first and second conductive planes; and a second conductive via electrically connecting the second transmission line to the second conductive plane.

12. The waveguide structure according to claim 1, wherein the transmission line included in at least one of the plurality of unit structures has a spiral shape in which the first end of the transmission line is spirally wound about the second end of the transmission line positionally matching the conductive via in a plan view.

13. The waveguide structure according to claim 1, wherein the transmission line included in at least one of the plurality of units structures has a meandering shape in which the first end of the transmission line is meandered from the second end of the transmission line positionally matching the conductive via in a plan view.

14. The waveguide structure according to claim 1, as comprising an electromagnetic band-gap (EBG) structure designed to suppress electromagnetic waves from propagating in a specific frequency band.

15. The waveguide structure according to claim 1, as implemented on a printed-circuit board.

16. The waveguide structure according to claim 15, wherein the waveguide structure on the printed-circuit board comprises a first waveguide structure in a first predetermined area on the printed-circuit board, and wherein the printed-circuit board further includes a second waveguide structure in a second predetermined area of the printed-circuit board, the first and second waveguide structures configured to have two different band gaps.

17. The waveguide structure according to claim 1, wherein the transmission line is disposed outside a first dielectric layer formed between the first conductive plane and the second conductive plane, wherein a second dielectric layer and wherein a thickness of the second dielectric layer is smaller than a thickness of the first dielectric layer.

* * * * *